US009460976B2

(12) United States Patent
Garden et al.

(10) Patent No.: US 9,460,976 B2
(45) Date of Patent: Oct. 4, 2016

(54) ENCAPSULATED ARRAYS OF ELECTRONIC SWITCHING DEVICES

(75) Inventors: Daniel Garden, Cambridge (GB); Jan Jongman, Cambridge (GB); Martin Lewis, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 16 days.

(21) Appl. No.: 14/004,077

(22) PCT Filed: Mar. 16, 2012

(86) PCT No.: PCT/EP2012/054734
§ 371 (c)(1),
(2), (4) Date: Nov. 5, 2013

(87) PCT Pub. No.: WO2012/123587
PCT Pub. Date: Sep. 20, 2012

(65) Prior Publication Data

US 2014/0048921 A1 Feb. 20, 2014

(30) Foreign Application Priority Data

Mar. 17, 2011 (GB) .................................. 1104466.6

(51) Int. Cl.

| | |
|---|---|
| ***H01L 23/20*** | (2006.01) |
| ***H01L 23/26*** | (2006.01) |
| ***G02F 1/161*** | (2006.01) |
| ***H01L 51/52*** | (2006.01) |
| ***H01L 27/28*** | (2006.01) |
| ***H01L 21/56*** | (2006.01) |
| ***H01L 23/10*** | (2006.01) |

(52) U.S. Cl.
CPC ............... *H01L 23/26* (2013.01); *G02F 1/161* (2013.01); *H01L 21/56* (2013.01); *H01L 23/10* (2013.01); *H01L 27/283* (2013.01); *H01L 51/5259* (2013.01); *H01L 2924/0002* (2013.01)

(58) Field of Classification Search
CPC ....... H01L 23/26; H01L 23/10; H01L 21/56; H01L 2924/002; H01L 27/283
USPC ................................................ 257/682, 788
See application file for complete search history.

(56) References Cited

U.S. PATENT DOCUMENTS

| | | | |
|---|---|---|---|
| 2004/0082089 | A1 | 4/2004 | Cheng et al. |
| 2006/0066234 | A1 | 3/2006 | Lu et al. |
| 2009/0215279 | A1 | 8/2009 | Kim et al. |

(Continued)

FOREIGN PATENT DOCUMENTS

| | | |
|---|---|---|
| EP | 1 814 161 A2 | 8/2007 |
| EP | 1 814 180 A2 | 8/2007 |

(Continued)

OTHER PUBLICATIONS

Hoshino et al., "Influence of moisture on device characteristics of polythiophene-based field-effect transistors", May 1, 2004, Journal of Applied Physics, vol. 95, No. 9.
Communication dated Aug. 13, 2015 from the Intellectual Property Office of Great Britain in counterpart application No. GB1104466.6.

*Primary Examiner* — Hoa B Trinh
(74) *Attorney, Agent, or Firm* — Sughrue Mion, PLLC

(57) ABSTRACT

An electronic switching device array encapsulated in an encapsulating structure; wherein said array is exposed to one or more gas pockets between said array and said encapsulating structure.

13 Claims, 3 Drawing Sheets

(56) References Cited

U.S. PATENT DOCUMENTS

2010/0052520 A1 3/2010 Jeon et al.
2010/0084648 A1 4/2010 Watanabe
2010/0300746 A1 12/2010 Mackenzie et al.
2011/0122628 A1 5/2011 Han
2012/0146240 A1* 6/2012 Dairiki et al. ................ 257/777

FOREIGN PATENT DOCUMENTS

EP 2 190 043 A1 5/2010
EP 2 259 323 A2 12/2010

* cited by examiner

ENCAPSULATED ARRAYS OF ELECTRONIC SWITCHING DEVICES

CROSS REFERENCE TO RELATED APPLICATIONS

This application is a National Stage of International Application No. PCT/EP2012/054734 filed Mar. 16, 2012, claiming priority based on British Patent Application No. 1104466.6 filed Mar. 17, 2011, the contents of all of which are incorporated herein by reference in their entirety.

Many electronic devices comprise an array of electronic switching devices.

Examples of such electronic devices include pixellated liquid crystal display devices and pixellated electrophoretic display devices.

Such arrays of electronic switching devices are typically encapsulated against the ingress of moisture which can be harmful. It has been observed that some arrays of electronic switching devices are susceptible to degradation, even with effective encapsulation of the array against the ingress of moisture. Such degradation has been observed as reduced device performance such as negative threshold voltage shift and on-current suppression.

There has been identified the challenge of providing an encapsulated array of electronic switching devices that is less susceptible to such degradation.

It is an aim of the present invention to meet such challenge.

There is hereby provided an apparatus comprising: an electronic switching device array encapsulated in an encapsulating structure; wherein said array is exposed to one or more gas pockets between said array and said encapsulating structure.

In one embodiment, said array is exposed to said one or more gas pockets via a substrate supporting the array.

In one embodiment, said encapsulating structure includes a support structure and a gasket sandwiched between a lower surface of at least a periphery portion of the plastic substrate and at least a periphery portion of an upper surface of the support structure, and said one or more gas pockets are defined by said gasket, a central portion of the substrate and a central portion of the support structure.

In one embodiment, one or more of said support structure and gasket define one or more inlets to said one or more gas pockets exhibiting a higher transmission for oxygen gas than for moisture.

In one embodiment, at least one of said one or more inlets is defined at one or more interfaces between the gasket and the support structure and/or between the gasket and the substrate.

In one embodiment, said gasket comprises a spacer and layers of adhesive for adhering the spacer to a surface of the plastic substrate and a surface of the support structure.

In one embodiment, said support structure comprises a metal support structure.

In one embodiment, the apparatus further comprises: a display module mounted above the array and operable via the array, which display module incorporates harmful species capable of diffusion to the array.

In one embodiment, the harmful species comprise volatile organic species.

In one embodiment, the array defines an active matrix for independently controlling the electric potential at each of an array of pixel electrodes.

In one embodiment, said one or more gas pocket are one or more air pockets.

In one embodiment, said one or more gas pockets project onto array an area substantially no less than the footprint of the array.

In one embodiment, each electronic switching device of said array is associated with a respective pixel of a display device; and said one or more gas pockets define a respective volume of air for each pixel of at least 1.4 milliliters.

There is also provided a method, comprising: encapsulating an electronic switching device array in an encapsulating structure whilst deliberately exposing said array to one or more gas pockets between said array and said encapsulating structure.

There is also provided an electronic device incorporating a means of controlling harmful species, by deactivation or destroying the species, or other means of reducing the number of harmful species coming into contact with the chemically-sensitive layers of the device.

To help understanding of the invention, a specific embodiment thereof will now be described by way of example only and with reference to the accompanying drawings, in which.

Figure 1:
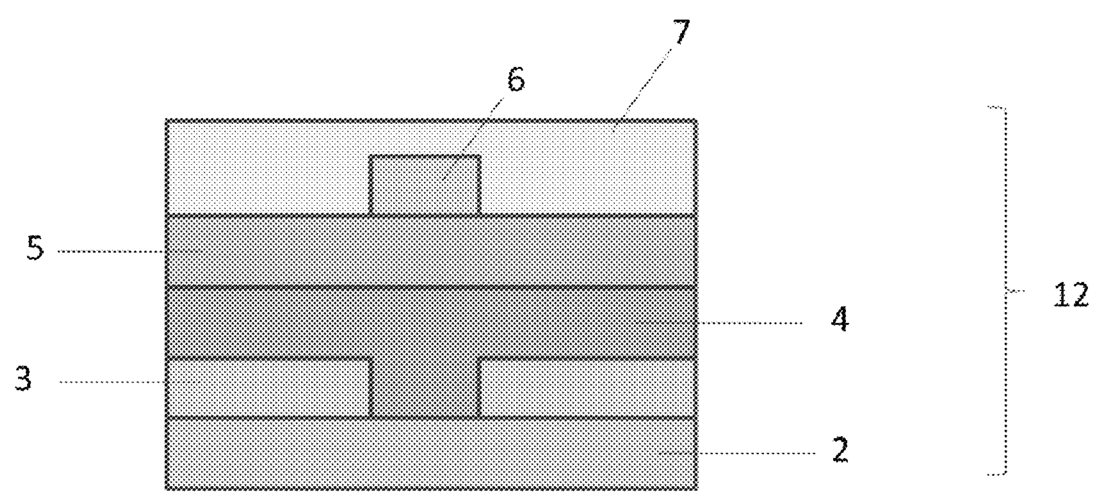
FIG. 1 shows an example of a top-gate architecture for a TFT array.

FIG. 1 illustrates an example of a basic architecture for the example of a two-dimensional array of top-gate thin-film-transistors (TFT). A patterned conductive layer 3 on a plastic substrate surface 2 defines source-drain electrode pairs (only one pair shown in FIG. 1) and interconnect lines (not shown in FIG. 1) for addressing the source electrodes. A patterned or unpatterned layer of semiconducting channel material 4 defines a semiconducting channel (only one shown in FIG. 1) between each pair of source and drain electrodes 3. One or more layers of insulating material 5 define gate dielectric regions over the semiconducting channels. An upper patterned conductive layer 6 defines an array of gate lines which each function as gate electrodes (only one shown in FIG. 1) for a respective line of transistors in the array. One or more layers 7 of insulating material insulate the gate lines from an overlying array of pixel electrodes (not shown), which pixel electrodes are each connected to a respective drain electrode by a conductive interlayer connector (not shown).

Figure 2:
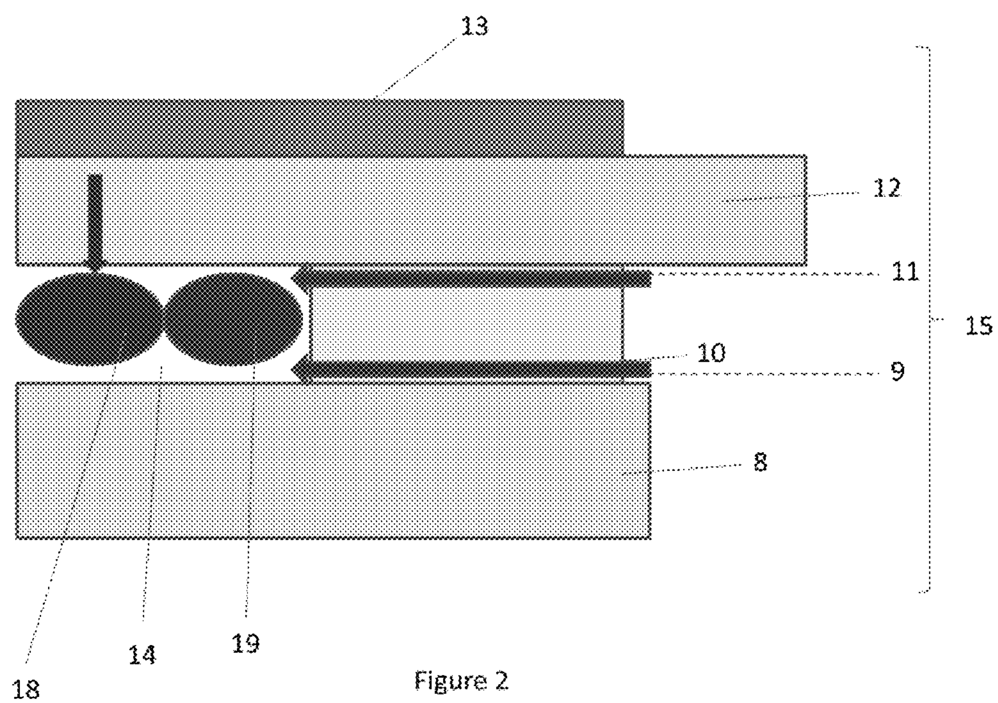
FIG. 2 illustrates an example of a device in accordance with an embodiment of the present invention.
Figure 3:
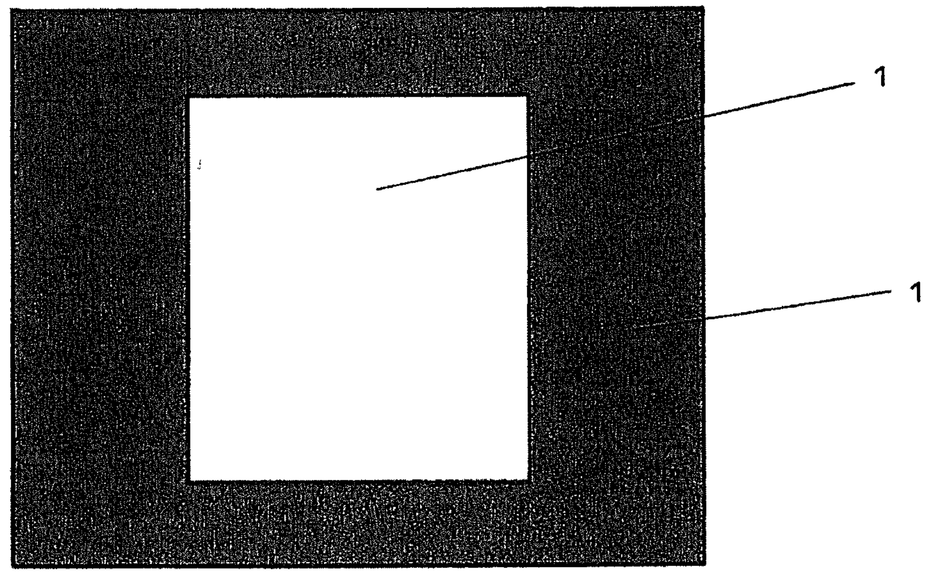
FIG. 3 illustrates the shape of a gasket used in the device of FIG. 2.

With reference to FIGS. 2 and 3, such a TFT array can be used to provide an active matrix backplane 12 for controlling a frontplane display media 13 (such as LCD or electrophoretic display media) mounted over the array of pixel electrodes. An active matrix backplane 12 of the kind described above is laminated onto a layer of sheet metal foil or sheet plastic, or any other material substantially impervious to moisture (referred to below as a mid-frame 8) via a gasket 10. The midframe 8 is rigid enough not to conform to the topographic profile defined by the gasket 10 and thereby defines a gap between the midframe 8 and the backplane 12.

The gasket 10 comprises a core film of a material substantially impervious to moisture such as a single component film of polyethylene terephthalate (PET), or a multi-component film such as a ceramic/PET film. The gasket 10 is laminated onto the backplane 12 and the midframe 8 by respective layers of pressure-sensitive adhesive.

The gasket 10 has a picture frame-shape as shown in FIG. 5 defining a central window 16 having x-y dimensions substantially corresponding to the footprint of the TFT array formed on the backplane 12. The body 17 of the gasket 10 is interposed between a periphery portion of the midframe 8 and a periphery portion of the backplane 12, i.e. the portion of the footprint of the backplane 12 that does not overlap with the footprint of the TFT array. The lamination of the midframe 8 to the backplane 12 via the gasket 10 is conducted at normal air pressure, whereby the gap defined by the backplane 12, gasket 10 and midframe 8 thus provides a pocket of air between the TFT array and the encapsulating structure.

The gasket 10 and midframe 8 together provide an adequate moisture seal to protect the active matrix backplane 12 from humid external environments.

The above-described design allows gaseous or volatile species within the TFT array (e.g. species resident in the TFT array as a result of the process used to produce the array, or species that may have migrated down into the TFT array from overlying layers, or species that may have ingressed into the TFT array from the external environment) to freely move behind the backplane 12.

Figure 4:
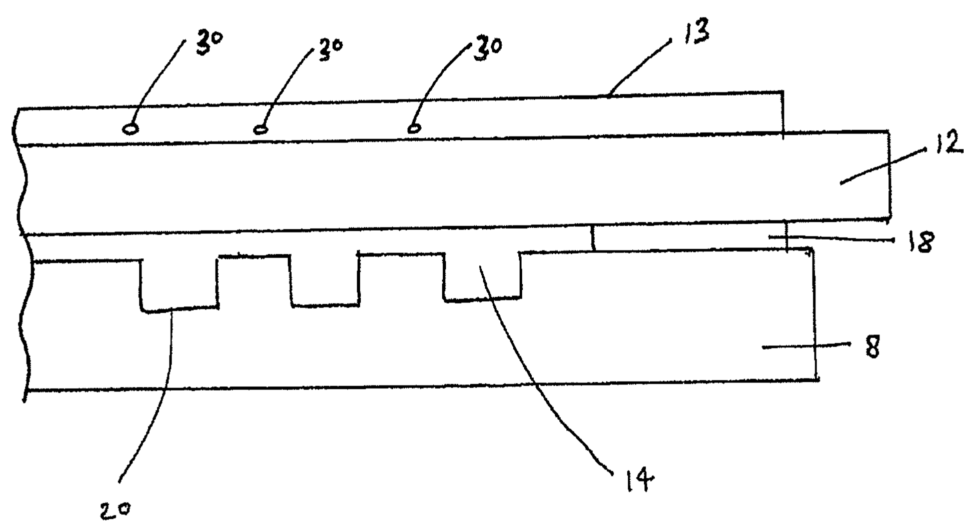
FIG. 4 illustrates an example of a device in accordance with another embodiment of the present invention.

With reference to FIG. 4, an alternative way of achieving the same kind of effect is to define a pattern of recesses 20 to a depth of e.g. 400 microns in the upper surface of the midframe, and then laminate the backplane 12 to the midframe 8 by means of pressure-sensitive adhesive (of the kind used in the FIG. 2 embodiment to laminate the gasket to the midframe and the backplane 12) at the perimeter of the midframe 8.

The pattern of recesses could, for example, comprise an array of individual flat-bottomed recesses each circular in plan, with a respective recess for each pixel of the backplane. Alternatively, the pattern of recesses could comprise an array of intersecting orthogonal grooves, with a respective intersection for each pixel of the backplane. The pattern of recesses can be defined by mechanical milling, or by chemical etching. The requirements of the midframe 8 are the same as for the FIG. 2 embodiment; it must have a low water vapour transmission rate (WVTR). On example of a suitable material is aluminium. The midframe 8 is sufficiently rigid to prevent flexing causing breaks in the adhesive seal 18 at the perimeter of the midframe.

It has been found that the reduction in degradation of the TFT array increases as the respective volume of air underlying each pixel of the backplane increases, i.e. as the respective volume of air accessible to each pixel increases. According to one example, the gap between the midframe 8 and the backplane 12 and/or the recesses defined in the upper surface of the midframe 8 provide below each pixel of the backplane 12 a respective volume of air of about 1.4 milliliters ($1.4\times10^{-6}$ $m^3$) or greater.

The observed reduction in degradation of the TFT array with this kind of design is thought to arise from the air pocket 14 providing a reservoir or housing for potentially harmful species, allowing such potentially harmful species to escape the stack of layers that defines the TFT array, thus reducing the harmful impact of such species on the TFT array and the device performance.

The adhesive interfaces 9, 11 between the gasket and the backplane 12 and the midframe 8 (or between the midframe 8 and the backplane in the FIG. 4 embodiment) are transmissive to some air species other than moisture, but the selective introduction (i.e. unaccompanied by moisture) of such air species 19 into the air pocket 14 is thought to be beneficial from the point of view of least partially neutralizing the degrading effects of potentially harmful species 18.

The above-described design thus allows benevolent air species 19 other than moisture to migrate from the external environment to the stack of layers that defines the TFT array without compromising protection of the TFT array against moisture. For example, gaseous oxygen is one air species that is thought to have a neutralizing ability on some potentially harmful species.

One example of devices where the above-described technique is of particular use is in devices including a TFT array defined by a stack of layers including one or more organic polymer layers, which can be particularly chemically-sensitive. During the processing of an organic polymer device, contaminants or impurities potentially harmful to organic polymers may unavoidably remain within the TFT array as result of the various processing steps. For example, the processing might leave contaminants/impurities that create carrier traps within an organic semiconductor layer. Carrier traps are sites at which an electron or hole becomes trapped and held until electron/hole pair is completed. A carrier trap may result in an undesirable increase in contact resistance, which may further result in an undesirable increase in the difficulty of injecting charge into the semiconductor/dielectric interface. This may have the negative effect of limiting the on-current of a transistor device. This in turn impacts on the ability to adequately charge a pixel capacitor associated with the transistor in a display device, which further has a negative effect on the performance of the transistor to drive the respective pixel of the pixellated display media.

There are many different ways in which species that are potentially harmful to organic polymer layers can end up in the TFT array.

An example of a production process that has the unavoidable side-effect of leaving residual species that may damage organic polymer layers of the device is a solution-processing technique in which solvents are used to deposit one or more layers of the stack that defines the TFT array. Solvents used in the production process may remain within the stack, for example, where the layers have not been sufficiently dried or cured. Subsequent processing of the overlying layers of the device results in the solvent residues being effectively sealed within the layers. Examples of solvents aggressive to organic polymer layers include MEK (Methyl Ethyl Ketones) and NMP (N-Methylpyrrolidone). Also, water used in rinsing steps may also become trapped within the layers of the device, and is another potential source of degradation to organic polymer layers.

Even where harmful species originate in one or more layers overlying sensitive organic polymer layers, the harmful species can dissipate through the multi-layer-stack. The integration of chemically-sensitive layers, such as certain organic polymer layers, with other layers of a multi-layer stack containing volatile or reactive species can therefore result in a risk of degradation to the chemically-sensitive layers of the multi-layer stack, as the reactive or volatile species move between layers of the multi-layer stack. The harmful species may, for example, be ionic species. Examples of such potentially harmful ionic species include $Cl^-$ and $H^+$ ions.

High processing temperatures can increase the risk of contaminants migrating through the stack of layers that defines the TFT array. If the contaminants consist of polar molecules, then there is the risk that they may bond with oppositely charged sites or the semiconductor/dielectric interface, thus increasing the contact resistance.

Another source of species that are potentially harmful to sensitive organic polymer layers of an organic TFT array can be mobile species 30 that originate within the frontplane display media 13 formed over the TFT array and migrate into the TFT array.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An apparatus, comprising:

a stack of layers defining one or more electronic switching devices, and a frontplane including liquid crystal or electrophoretic display media, wherein said stack of layers is exposed to oxygen and protected against migration of moisture from an external environment, said stack of layers is encapsulated in an encapsulating structure, and is exposed to one or more gas pockets between said stack of layers and said encapsulating structure, and said frontplane is on a side of the stack of layers opposite to the gas pockets.

2. The apparatus according to claim 1, wherein said stack of layers is exposed to said one or more gas pockets via a substrate supporting the stack of layers.

3. The apparatus according to claim 1, wherein said encapsulating structure includes a support structure and a gasket sandwiched between a lower surface of at least a periphery portion of the substrate and at least a periphery portion of an upper surface of the support structure, and said one or more gas pockets are defined by said gasket, a central portion of the substrate and a central portion of the support structure.

4. The apparatus according to claim 3, wherein one or more of said support structure and gasket define one or more inlets to said one or more gas pockets exhibiting a higher transmission for oxygen gas than for moisture.

5. The apparatus according to claim 4, wherein at least one of said one or more inlets is defined at one or more interfaces between the gasket and the support structure and/or between the gasket and the substrate.

6. The apparatus according to claim 3, wherein said gasket comprises a spacer and layers of adhesive for adhering the spacer to a surface of the plastic substrate and a surface of the support structure.

7. The apparatus according to claim 3, wherein said support structure comprises a metal support structure.

8. The apparatus according to claim 1, wherein the stack of layers defines an electronic switching device array, and wherein the frontplane is mounted above the array and operable via the array.

9. The apparatus according to claim 1, wherein the stack of layers defines an active matrix for independently controlling the electric potential at each of an array of pixel electrodes.

10. The apparatus according to claim 1, wherein said one or more gas pocket are one or more air pockets.

11. The apparatus according to claim 9, wherein said one or more gas pockets project onto the array an area substantially no less than the footprint of the array.

12. The apparatus according to claim 9 wherein said one or more gas pockets define a respective volume of air for each pixel of a display device of at least 1.4 milliliters.

13. The apparatus according to claim 1, wherein the stack of layers defining said one or more electronic switching devices comprises an organic semiconductor layer.

* * * * *